(12) United States Patent
Magoon et al.

(10) Patent No.: US 8,577,312 B2
(45) Date of Patent: *Nov. 5, 2013

(54) POWER AMPLIFIER AMPLITUDE MODULATOR SYSTEM AND METHOD

(75) Inventors: Rahul Magoon, Irvine, CA (US); Scott D. Kee, Dana Point, CA (US); Seyed-Ali Hajimiri, Pasadena, CA (US); Ichiro Aoki, San Clemente, CA (US); Roberto Aparicio Joo, Newport Beach, CA (US); Morten Damgaard, Laguna Hills, CA (US); Setu Mohta, Tustin, CA (US); Geoff Hatcher, Irvine, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/231,833

(22) Filed: Sep. 13, 2011

(65) Prior Publication Data

US 2012/0001693 A1    Jan. 5, 2012

Related U.S. Application Data

(63) Continuation of application No. 11/827,185, filed on Jul. 11, 2007, now Pat. No. 8,019,292.

(51) Int. Cl.
*H04B 1/40* (2006.01)
(52) U.S. Cl.
USPC ........................................................ 455/126
(58) Field of Classification Search
USPC .......... 455/91, 112, 114.1, 115.1, 126, 127.1; 330/129, 279, 281, 282, 295
See application file for complete search history.

(56) References Cited

U.S. PATENT DOCUMENTS

| | | | |
|---|---|---|---|
| 4,181,889 A | 1/1980 | Davis et al. |
| 5,319,804 A | 6/1994 | Matsumoto et al. |
| 6,020,787 A | 2/2000 | Kim et al. |
| 6,917,245 B2 | 7/2005 | Dupuis et al. |
| 2002/0125945 A1 | 9/2002 | Taylor |
| 2004/0178852 A1 | 9/2004 | Neunaber |

FOREIGN PATENT DOCUMENTS

EP    0430707 A2    6/1991
WO    2005098880    10/2005

OTHER PUBLICATIONS

European Patent Office, International Search Report and Written Opinion, PCT Application No. PCT/US2008/069615, Nov. 5, 2008.
The International Bureau of WIPO, International Preliminary Report on Patentability, PCT Application No. PCT/US2008/069615, Jan. 12, 2010.

*Primary Examiner* — Thanh Le
(74) *Attorney, Agent, or Firm* — Jackson Walker L.L.P.; Christopher J. Rourk

(57) ABSTRACT

A system for controlling amplifier power is provided. The system includes a voltage envelope detector receiving a voltage signal and generating an attenuated voltage envelope signal. A current envelope detector receives a current signal and generates an attenuated current envelope signal. A controller receives power level data and generates attenuation control data for the voltage envelope signal and the current envelope signal. A detector receives the voltage envelope signal and the current envelope signal and generates a control signal based on the greater of the voltage envelope signal and the current envelope signal. A power amplifier level controller receives the control signal and generates a power amplifier level control signal.

20 Claims, 10 Drawing Sheets

POWER AMPLIFIER AMPLITUDE MODULATOR SYSTEM AND METHOD

The present application is a continuation of U.S. Ser. No. 11/827,185, filed Jul. 11, 2007, entitled "POWER AMPLIFIER AMPLITUDE MODULATOR SYSTEM AND METHOD" which is hereby incorporated by reference for all purposes.

FIELD OF THE INVENTION

The present invention relates to power amplifier amplitude modulation, and more particularly to a system and method for power amplifier control that prevents clipping of the power amplifier output at high output levels and distortion of the power amplifier output at low output levels.

BACKGROUND OF THE INVENTION

In many applications utilizing a power amplifier, it is desirable to produce an amplitude modulated output. For instance, in Enhanced Data for GSM Evolution ("EDGE") cellular phones, the power amplifier may be required to produce an amplitude modulated signal during a data transmission burst. Other systems can also have this requirement, such as code-division multiple-access (CDMA), wideband CDMA (WCDMA), 802.11, and other transmission systems.

FIG. 1 is a diagram 100 of a representative plot of the output power of a prior art power amplifier in a time-division multiple-access communications system using amplitude modulation, such as in EDGE cellular telephony. The output power of the power amplifier, indicated by the representative curve 101, may be controlled from a low level before transmitting data, modulated about a higher level when transmitting data in data transmission burst region 103, and then brought down to a low level after the data is sent. Many systems have requirements that the power must be held between certain levels, indicated by the power mask 102, so that the power is held within specified limits at all times during the transmission. It is also common that the output frequency spectrum has limits placed on it so that the particular shape of the ramp up, ramp down, and modulation may need to be accurately controlled. If the shape deviates from the desired shape, the output frequency spectrum may fail these limits. Additionally, the data transmission burst region 103 can have strict requirements on signal distortion in this region in order to ensure that the transmitted data can be recovered by a receiver or to avoid corruption of data being transmitted between other devices in a nearby channel. It is also often desirable to have accurate control over the output power within data transmission burst region 103. Each of these requirements may have to be met by the transmitter system.

One way in which signal modulation may be accomplished is by utilizing a polar transmission loop. In a polar transmission loop, the desired transmit signal can be decomposed into an amplitude modulation component and a phase modulation component. The amplitude modulation component can be then produced using a power amplifier whose output power can be controlled, such as by using a variable gain power amplifier or a power control loop. The phase modulation component is typically produced by providing the input to the power amplifier as an appropriately phase-modulated signal.

FIG. 2 is a diagram of a prior art system 200 that provides power amplifier and polar modulation using output voltage detection. Although open-loop polar modulation can be used, closed-loop polar modulation can be advantageous when modulation accuracy is desired. System 200 includes power amplifier 212, radio frequency (RF) amplitude detector 215, error amplifier 217, modulation control circuit 203, and phase modulator 204. Modulation control circuit 203 receives modulation signal 202 and produces an amplitude modulation control signal 218 and a phase modulation control signal 205. Modulation signal 202 can be quadrature control signals such as I/Q signals, data streams such as bits to be transmitted, or other suitable signals. Phase modulation control signal 205 is used to produce phase modulated RF signal 213, such as by using phase modulator 204 and unmodulated RF source signal 201. Alternately, phase modulated RF signal 213 can be produced from phase modulation control signal 205 using a phase locked loop (PLL), a modulator employing mixers, or in another suitable manner.

Power amplifier 212 receives phase modulated RF signal 213 as an input, which it amplifies to produce RF output 214. The amplitude of RF output 214 can be adjusted by control signal 219. RF amplitude detector 215 generates a feedback signal 216 related to the sensed amplitude of RF output 214. Error amplifier 217, which can be an integrating amplifier or other suitable differencing amplifiers, compares feedback signal 216 to amplitude modulation control signal 218 so as to adjust control signal 219 to reduce the difference between the feedback and modulation control signals. In this manner, amplitude modulation control signal 218 can control the output power or amplitude of the power amplifier. Other types of detectors can be also or alternatively be used to generate feedback signal 216, such as a detector sensing the output RF current, a detector sensing the power from a directional coupler, or other suitable detectors or circuits.

An issue that can arise in systems using closed loop polar feedback is that amplitude modulation control signal 218 can be sufficiently high that power amplifier 212 is not capable of producing the requested output power. This can occur, for instance, if the power amplifier is presented with a load mismatch so that under this mismatch the power output capability of the power amplifier is reduced. This can also occur under a load mismatch if RF amplitude detector 215 incorrectly estimates that the output power of power amplifier 212 is lower than the actual output power, causing polar modulation loop to attempt to produce a higher output power than actually required.

If the power amplifier is incapable of generating the output power level that is required in response to control signal 219, the output power can be less than the requested power for the duration of time wherein the power requested is higher than can be made. Because the loop can only produce the power amplifier's maximum output power, the output signal can result in clipped-off peaks in the output level which are higher than the maximum power that the power amplifier can produce. This clipping of the output power can be disadvantageous in multiple ways, as discussed below.

FIG. 3 is a diagram 300 of a representative prior art power versus time plot in a situation where clipping occurs. Waveform 301 depicts the output power of power amplifier 212 across a transmission time slot in a typical Time Division Multiple Access (TDMA) system such as EDGE. In this case, requested output power 304 is at times higher than the maximum power that the amplifier can produce, as indicated by line 302. At the times when the amplifier is requested to make more power than this maximum power, the amplifier will typically instead produce its maximum power such as is indicated by several flattened-top regions 305.

This response can cause a failure to pass the power mask 102 of the time mask, as the power waveform in the region around area 308 can be above the mask. Additionally, a sharp corner in the power versus time plot such as area 309 can cause failure to comply with the output frequency spectrum. Signal distortions in the data transmission burst region 103 can also cause failure to comply with output modulation spectrum during the data burst, which can be have even tighter limits. Furthermore, signal clipping in data transmission burst region 103 can distort the transmitted output signal, potentially degrading the ability of the receiver to recover the transmitted signal correctly. Measures of signal quality such as error vector magnitude (EVM) and bit error rate (BER) can be adversely impacted by this signal clipping.

Another issue that can arise in systems using closed loop polar feedback is that RF output 214 can, under certain circumstances, be sufficiently low that RF amplitude detector 215 is not able to correctly detect the amplitude of RF output 214. This condition can occur, for instance, if the amplitude modulation control signal 218 is at a sufficiently low level such as if the desired transmit power is low. In many applications, such as cellular telephony, it can be necessary to transmit at several different power levels. When transmitting at the lower power levels, RF amplitude detector 215 may not receive a large enough signal to correctly detect the transmitted amplitude.

FIG. 4 a diagram 400 of an input to output relationship of a prior art RF detector such as may be used to implement RF amplitude detector 215. Solid line waveform 401 depicts feedback signal 216 of RF amplitude detector 215 versus the amplitude of RF output 214 applied to the detector's input. A prior art detector may exploit a nonlinearity of a device inside of the detector and so may require a sufficiently large input signal in order to activate that nonlinearity and respond to further changes in RF input level. This nonlinearity can result in an effective input offset amplitude 402, so that a linear extrapolation of the input-output response of waveform 401 diverges away from the actual response at low input amplitudes. Distortion of input-output response of waveform 401 at low amplitudes can be a result of other problems in prior art systems, such as crossover distortion, transistor mismatch, and other mechanisms. As a result of this distortion at low input amplitude, RF amplitude detector 215 may provide useful feedback only over a range of sufficiently large signal amplitudes, such as range 403, and may fail to meet system requirements at low signal amplitude levels.

FIG. 5 is a diagram 500 of a representative prior art power versus time plot where a prior art RF amplitude detector 215 is not receiving sufficient signal amplitude. Waveform 501 depicts a desired output power of power amplifier 212 across a transmission time slot in a typical TDMA system such as EDGE. In this case, the desired output power of waveform 501 is at times lower than the minimum power that RF amplitude detector 215 can accurately detect. At the times when the amplifier is requested to make less power than this minimum power, the amplifier will typically instead produce an output power depicted by waveform 502, which is different from the desired output power of waveform 501. For instance, if RF amplitude detector 215 has a response similar to the one depicted in FIG. 4, the output power can be higher than desired since the detector can interpret the output power as being lower than it actually is.

This distortion can cause failure to comply with output modulation spectrum limits. Furthermore, if such signal distortion occurs in data transmission burst region 103, the ability of a receiver to recover the transmitted signal correctly can be degraded. Measures of signal quality such as error vector magnitude (EVM) and bit error rate (BER) can be adversely impacted by this signal distortion.

SUMMARY OF THE INVENTION

Therefore, a system and method for power amplifier closed loop amplitude modulation and power control are provided that use a voltage envelope detector and current envelope detector to avoid power amplifier clipping. Furthermore, this power amplitude modulation and power control system and method can reduce amplitude variation to the detectors, reducing the potential for distortion at low amplitudes.

In accordance with an exemplary embodiment of the invention, a system for controlling amplifier power is provided. The system includes a voltage envelope detector receiving a voltage signal and generating an attenuated voltage envelope signal. A current envelope detector receives a current signal and generates an attenuated current envelope signal. A controller receives power level data and generates attenuation control data for the voltage envelope signal and the current envelope signal. A detector receives the voltage envelope signal and the current envelope signal and generates a control signal based on the greater of the voltage envelope signal and the current envelope signal. A power amplifier level controller receives the control signal and generates a power amplifier level control signal.

The present invention provides many important technical advantages. One important technical advantage of the present invention is a system and method for controlling amplifier power that prevent clipping of amplifier output at high output levels, and distortion of the amplifier output at low output levels.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
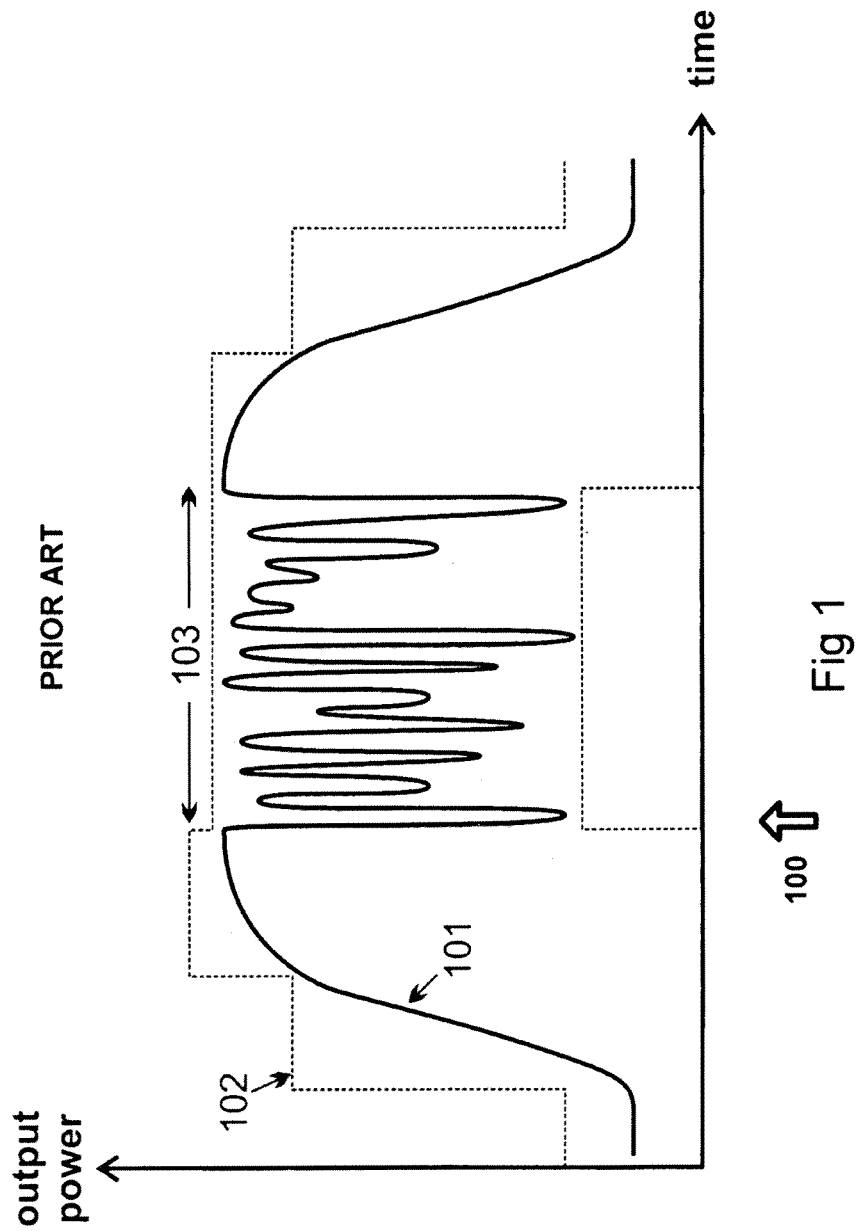
FIG. 1 is a diagram of a representative plot of the output power of a prior art power amplifier in a time-division multiple-access communications system using amplitude modulation.
Figure 2:
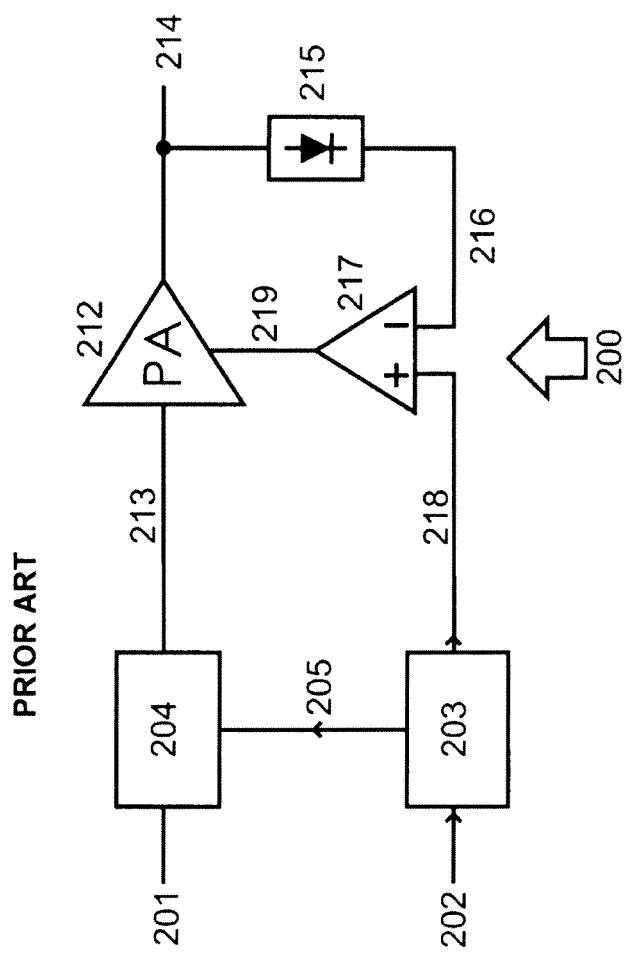
FIG. 2 is a diagram of a prior art system that provides power amplifier and polar modulation using output voltage detection.
Figure 3:
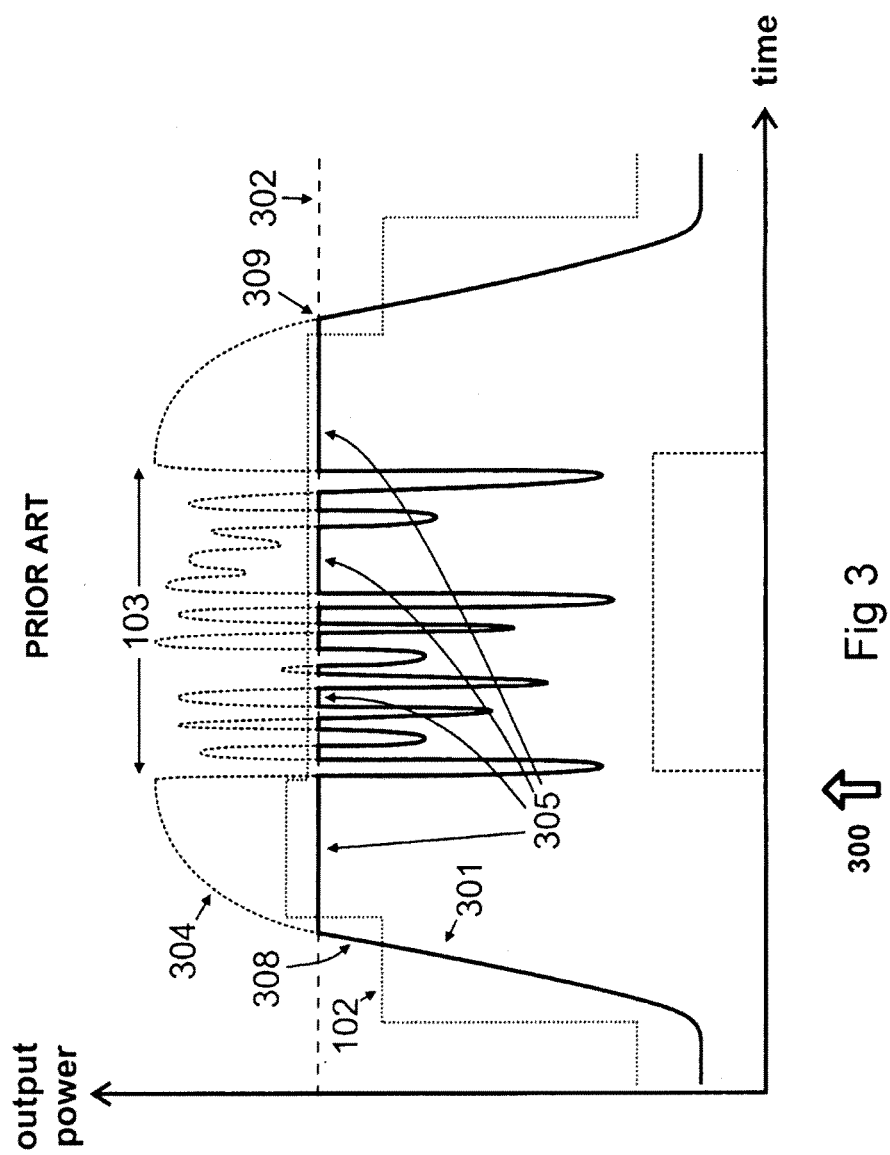
FIG. 3 is a diagram of a representative prior art power versus time plot in a situation where clipping occurs.
Figure 4:
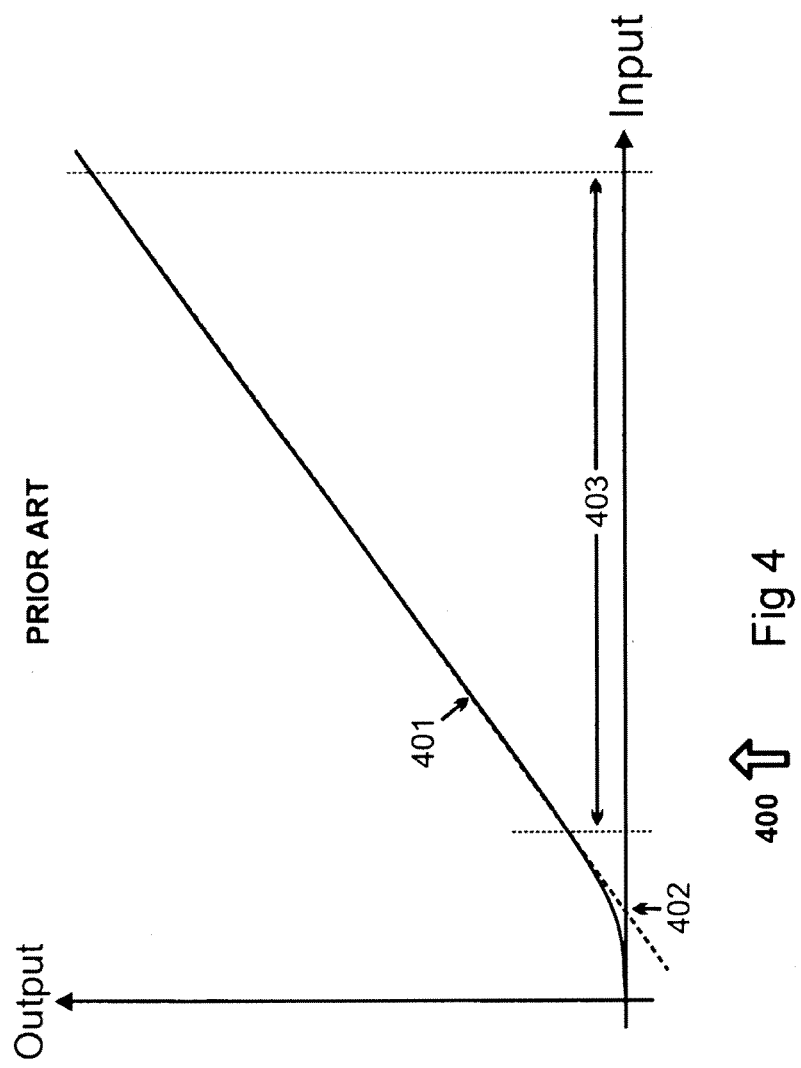
FIG. 4 a diagram of an input to output relationship of a prior art RF detector.
Figure 5:
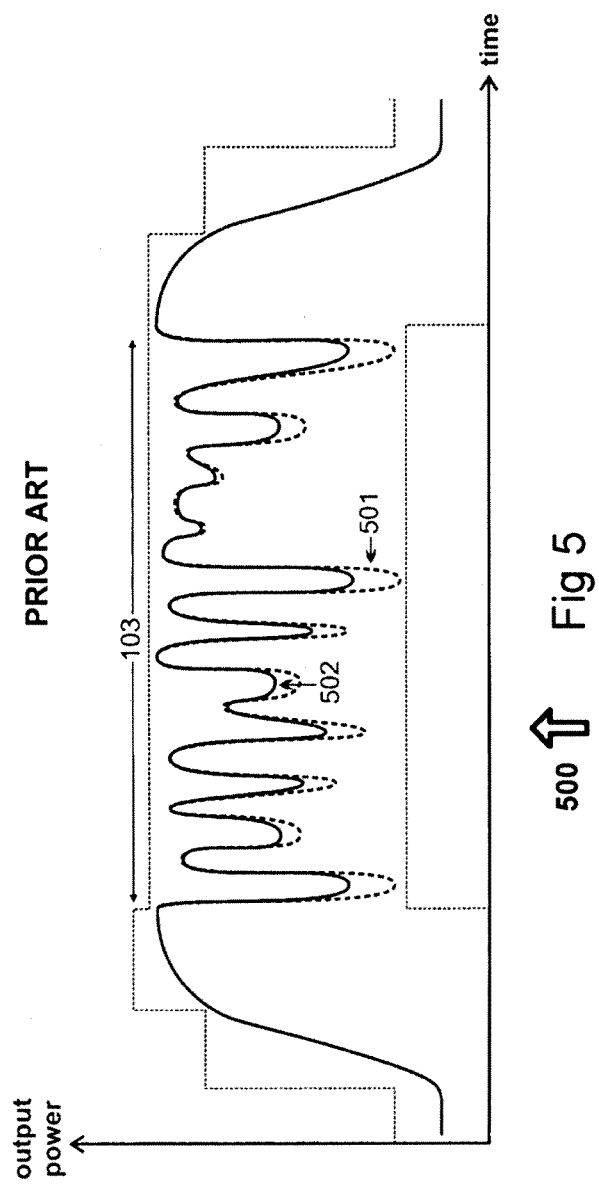
FIG. 5 is a diagram of a representative prior art power versus time plot where a prior art detector is not receiving sufficient signal amplitude.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

Figure 6:
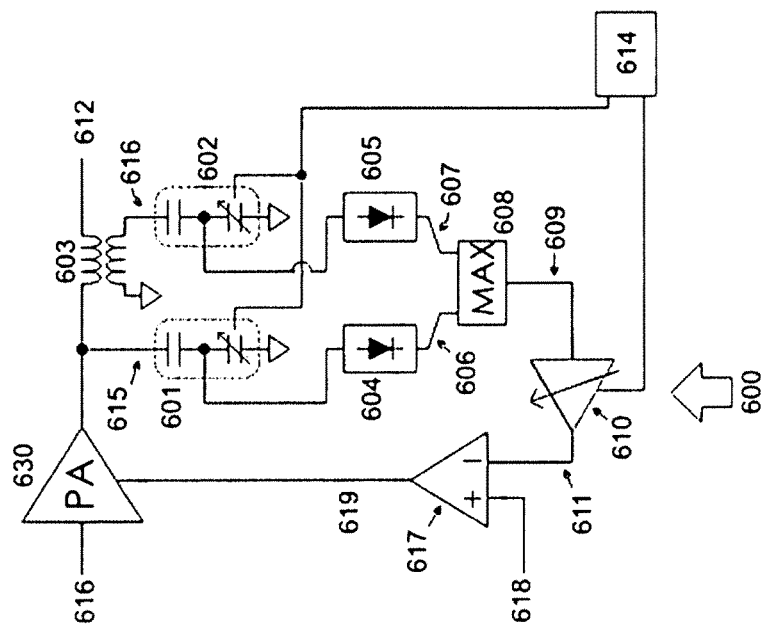
FIG. 6 is a diagram of a power control system in accordance with an exemplary embodiment of the present invention.

FIG. 6 is a diagram of power control system 600 in accordance with an exemplary embodiment of the present invention. Power control system 600 can be implemented in silicon, silicon germanium, gallium arsenide, or other suitable materials. Likewise, power control system 600 can be implemented on a single integrated circuit, from discrete components, from a combination of integrated circuits and discrete components, or in other suitable manners. Power control system 600 can be used to implement an amplitude modulator, to implement a polar modulator such as by combining it with modulation control circuit 203 and phase modulator 204, or for other functions using amplitude modulation.

Power control system 600 generates a signal 606 that is proportional to the RF voltage envelope at the output and a signal 607 that is proportional to the RF current envelope at the output. Signal 606 can be generated by voltage envelope detector 604 or in other suitable manners. Signal 607 can be generated using current sense transformer 603 in combination with current envelope detector 605, or in other suitable manners. Detected feedback signal 611 of power control system 600 is generated from the greater of the voltage and current envelope signals, such as by using maximum value circuit 608 which outputs the greater of its two inputs. Error amplifier 617, which can be an integrating amplifier, a differencing amplifier, or other suitable circuits, compares the detected feedback signal 611 to a power control input signal 618 so as to adjust control signal 619 in a way which tends to reduce the difference between the detected feedback and input signals. In this manner, control signal 619 can control the output power of power amplifier 630. This control can be utilized to provide amplitude modulation to the output of power amplifier 630. Furthermore, control signal 619 can be used to provide average power level control and ramping.

By adjusting the constants of proportionality between the RF voltage and current envelopes and their respective detected signals 606 and 607 as discussed below, the levels of signals 606 and 607 can be controlled so as to be similar when power amplifier 630 is presented with the nominal/design load, such as 50 Ohms. In this manner, power control system 600 can avoid clipping of power amplifier 630, since the mismatch conditions which cause these events typically cause either the voltage or the current envelope to increase from their values when there is no load mismatch. As a result, detected feedback signal 611 can increase when this condition is present, causing the system to behave as if the output power were greater than it actually is, reducing the actual output power so that clipping can be reduced or eliminated.

Variable attenuator 601, disposed between power amplifier 630 and voltage envelope detector 604 can be used to modify the signal level applied to voltage envelope detector 604. Variable attenuator 602, disposed between RF sense current 616 and current envelope detector 605, can be used to modify the signal level applied to current envelope detector 605. A control circuit 614 can be used to modify the amount of attenuation produced by variable attenuator 601, and the amount of attenuation produced by variable attenuator 602.

In one embodiment, control circuit 614 receives transmit power level data and sets the attenuations according to the expected average transmit power level so that control circuit 614 can reduce the attenuations as the average power level reduces. As the power level reduces, RF sense voltage 615 signal amplitude and RF sense current 616 signal amplitude can also reduce. By reducing the attenuation of variable attenuators 601 and 602 at low transmit powers, variable attenuators 601 and 602 and control circuit 614 can increase the input level to voltage envelope detector 604 and current envelope detector 605 at these lower power levels, so that voltage envelope detector 604 does not leave its useful input range and current envelope detector 605 does not leave its useful input range. In systems where changes in transmit power level can be known in advance of the change occurring, such as cellular telephone systems, control circuit 614 can set the attenuations of variable attenuators 601 and 602 according to the power level to be transmitted.

In certain cases, one of the voltage or current envelope sense signals may be difficult to detect when there is a large amplitude output from power amplifier 630. In this case, the weaker signal may have only a small attenuation or no attenuation at a maximum transmit power level. In such cases, the attenuator in series with the weaker signal can be omitted or replaced with a fixed attenuator so that the RF sense voltage 615 or RF sense current 616 is applied to the input of voltage envelope detector 604 or current envelope detector 605 without variable attenuation. Power control system 600 thus avoids clipping at high power by detecting both voltage and current. At lower powers, power control system 600 can transition towards detecting only the signal which is stronger at nominal load, as the attenuation in series with this signal is reduced. This operation allows power control system 600 to avoid clipping at high output powers while also avoiding detector nonlinearities at lower output powers when one of the voltage or current RF sense signals is relatively weak.

Optional variable gain amplifier 610 can be placed between maximum value circuit 608 and detected feedback signal 611. The gain of variable gain amplifier 610 can be controlled by control circuit 614, so as to reduce variation in loop gain caused by adjusting the attenuation of variable attenuators 601 and 602. In one exemplary embodiment, variable gain amplifier 610 is controlled so that its gain increases when an attenuation of variable attenuator 601 or 602 increases, so that variations in the gain of the feedback loop from power amplifier 630 to detected feedback signal 611 can be reduced. This process provides an increased margin for stability at low transmit powers when the feedback gain might otherwise increase, while preserving feedback loop bandwidth at higher transmit powers when the feedback gain might otherwise decrease.

Power control system 600 also avoids high voltage stress in power amplifier 630 under load mismatch. Since the output voltage or current envelope typically increases under the conditions that cause high voltage stress to occur on power amplifier 630, the resulting increase in detected feedback signal 611 can result in power amplifier 630 reducing its output power, which reduces such stress. Similarly, power control system 600 avoids high current stress in power amplifier 630.

Figure 7:
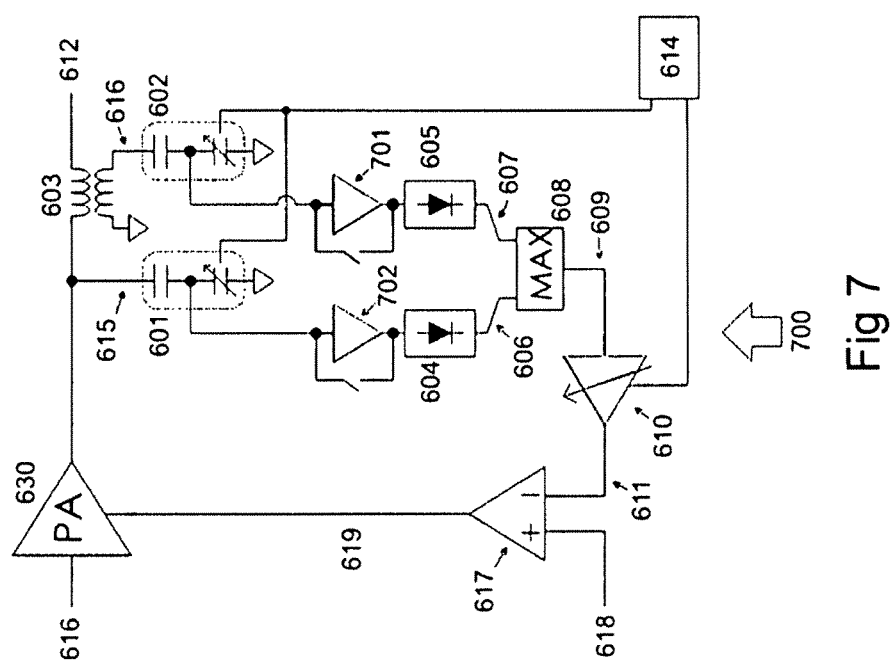
FIG. 7 is a diagram of a power control system in accordance with an exemplary embodiment of the present invention.

FIG. 7 is a diagram of power control system 700 in accordance with an exemplary embodiment of the present invention. Power control system 700 includes RF amplifier 701 disposed between variable attenuator 602 and current envelope detector 605, and RF amplifier 702 disposed between variable attenuator 601 and voltage envelope detector 604.

RF amplifier 701 increases the feedback gain through current envelope detector 605, and RF amplifier 702 increases the feedback gain through voltage envelope detector 604. This operation is advantageous if RF sense voltage 614 or RF sense current 616 is very small so that the input signal to voltage envelope detector 604 or current envelope detector 605, respectively, is outside the detector's useful range even when the attenuation setting of variable attenuator 602 is at its lowest value. Amplifiers 701 and 702 can also be used to increase the level of weak sense signals so that attenuators 601 and 602 can both be adjusted over a range of higher power levels so that both voltage and current are detected at these higher power levels.

When RE sense current 616 is at a higher value, such as when a large power is to be transmitted, the gain of RF amplifier 701 can be disabled, such as by using a switch between the amplifier's input and output, or in other suitable manners. RF amplifier 702 can be similarly disabled to decrease the feedback gain through the voltage envelope detector 604. This can be advantageous by reducing current consumption and noise at higher power levels.

Figure 8:
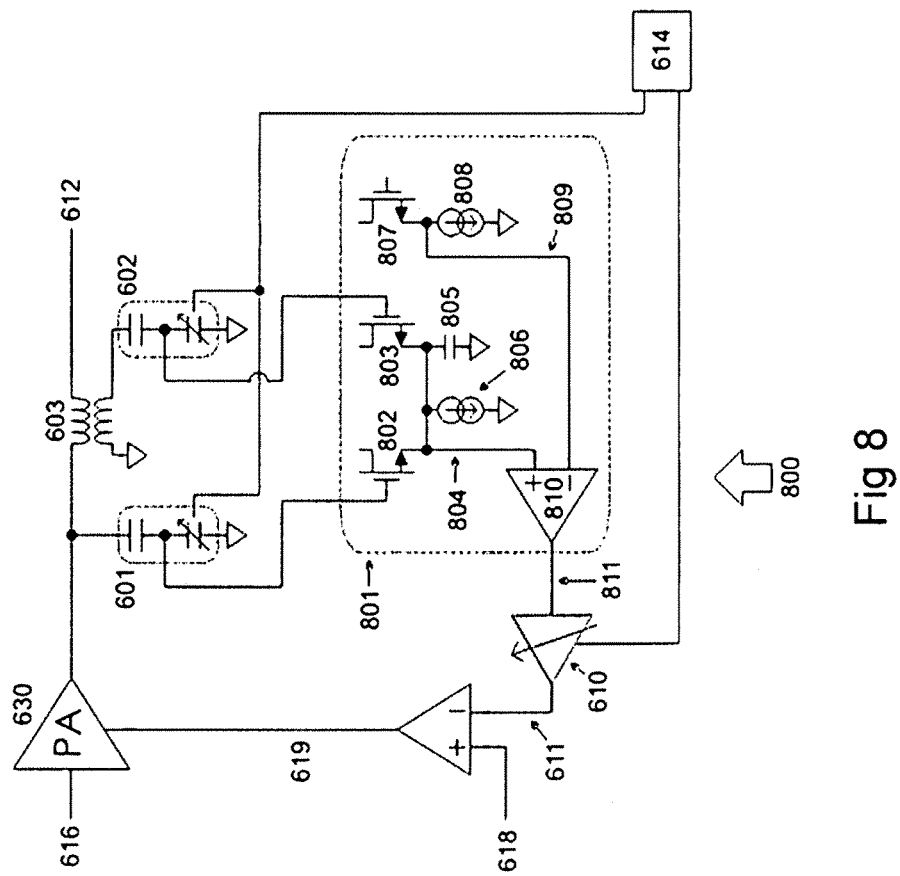
FIG. 8 is a diagram of a power control system in accordance with an exemplary embodiment of the present invention.

FIG. 8 is a diagram of power control system 800 in accordance with an exemplary embodiment of the present invention. Power control system 800 includes combined voltage/current detector 801 which generates signal 811 for use as a feedback signal. Combined voltage/current detector 801 includes transistors 802 and 803. Transistors 802 and 803 are connected so that their gates (if implemented as Field Effect Transistors (FETs)), bases (if implemented as bipolar junction transistors), or other suitable control terminals (if implemented as other devices) are provided with the RF output of variable attenuators 601 and 602 respectively. Furthermore, their sources, emitters, or other suitable current transmitting terminals are both connected to holding capacitor 805 at a node 804. Holding capacitor 805 is also coupled to voltage common/ground. The drain, collector, or other suitable current receiving terminal can be connected to a power supply or other suitable connection. A bias current 806 is also provided to node 804, such as by using a transistor configured to operate as a current source, by providing a resistor, or in another suitable manner. The signal at node 804 provides an indication of output signal amplitude to generate detected feedback signal 811.

Transistors 802 and 803 detect the current and voltage envelopes so that the voltage induced on node 804 is related to the greater of the envelopes of the RF signals applied to transistors 802 and 803. Power control system 800 allows the RE signal amplitudes provided to transistors 802 and 803 to have approximately the same amplitude when a nominal/design load is presented to power amplifier 630, such as by adjusting the attenuation of variable attenuators 601 and 602, choosing a suitable configuration for current sense transformer 603, or in other suitable manners, so that maximum value circuit 608 can be eliminated, which reduces the complexity and increases the reliability and efficiency of power control system 800.

When transistors 802 and 803 are used to implement combined voltage/current detector 801, a potential error due to offsets generated by variation in the threshold voltage of transistors 802 and 803 can occur. Optional replica transistor 807 and replica bias current 808 can be included to reduce these offsets. Replica transistor 807 can be matched to transistors 802 and 803, such as by using a similar physical layout of these devices, by using similar or scaled device sizes, by locating the devices in close proximity to one another when power control system is implemented as an integrated circuit to reduce the effect of process or material variations, or in another suitable manners. Similarly, replica bias current 808 can be matched to bias current 806. Using replica transistor 807 and replica bias current 808, a signal 809 can be generated which is related to the signal at node 804 when no RF amplitude is applied to transistors 802 and 803. This signal can then be subtracted from the signal at node 804, such as by using difference amplifier 810, to remove an offset from the signal at node 804.

Figure 9:
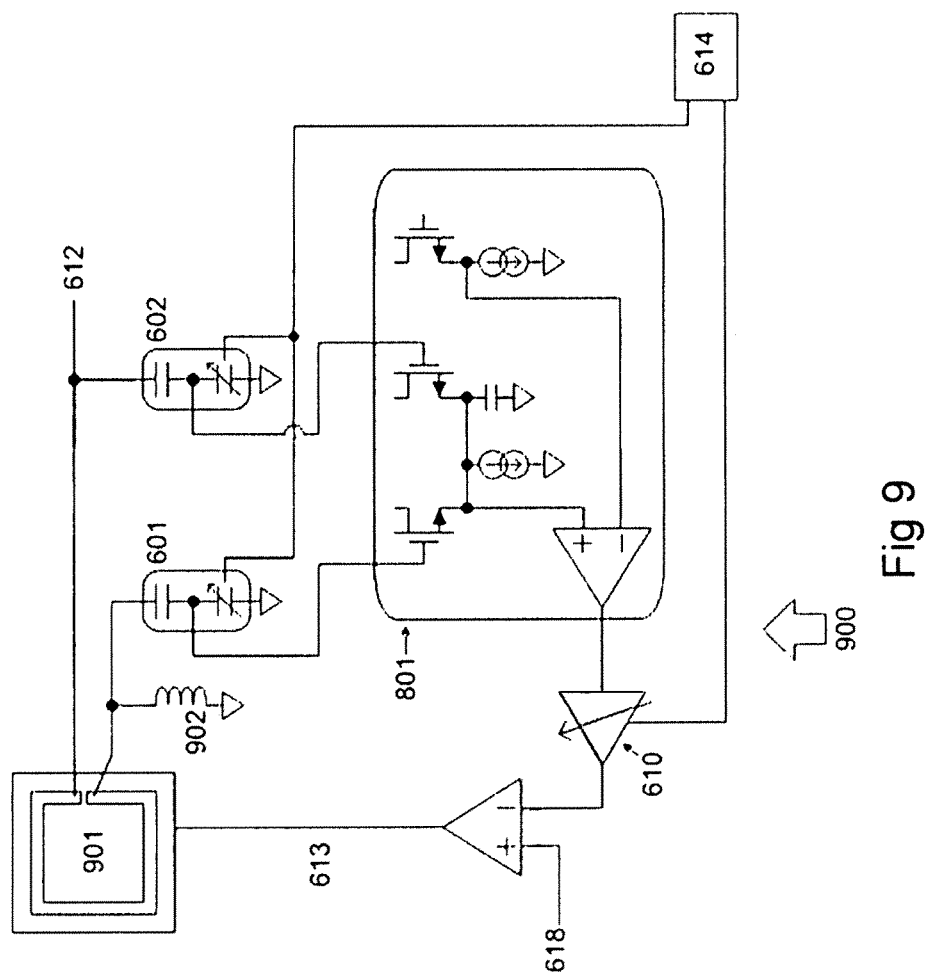
FIG. 9 is a diagram of a power control system with a distributed active transformer, in accordance with an exemplary embodiment of the present invention.

FIG. 9 is a diagram of power control system 900 with a distributed active transformer (DAT), in accordance with an exemplary embodiment of the present invention. Power control system 900 includes distributed active transformer (DAT) 901, such as that disclosed in U.S. Pat. Nos. 6,737,948 and 6,856,199, each of which is hereby incorporated by reference for all purposes. DAT 901 includes a bond wire 902 that connects the secondary of DAT 901 to ground. Since the current through bond wire 902 is substantially the same as the current delivered by DAT 901 to the load, the voltage induced on the inductance of bond wire 902 will be proportional to the output current of DAT 901. Power control system 900 senses the current envelope by coupling the voltage drop across bond wire 902 to combined voltage/current detector 801 for use as a current sense RF signal, thus providing a current sense RF signal without the need to add additional components between the output of DAT 901 and the load, and reducing the power loss that such current sensing components might bring. Additionally, the reduced component count can reduce size and cost of the system. Other amplifiers employing transformer-coupled outputs can also be used in place of DAT 901, such as by using an inductance in series with a grounded connection of the transformer secondary to generate a current sense RF signal. Likewise, DAT 901 can be used in place of power amplifier 630 in previously-described embodiments of the present invention, where suitable.

Figure 10:
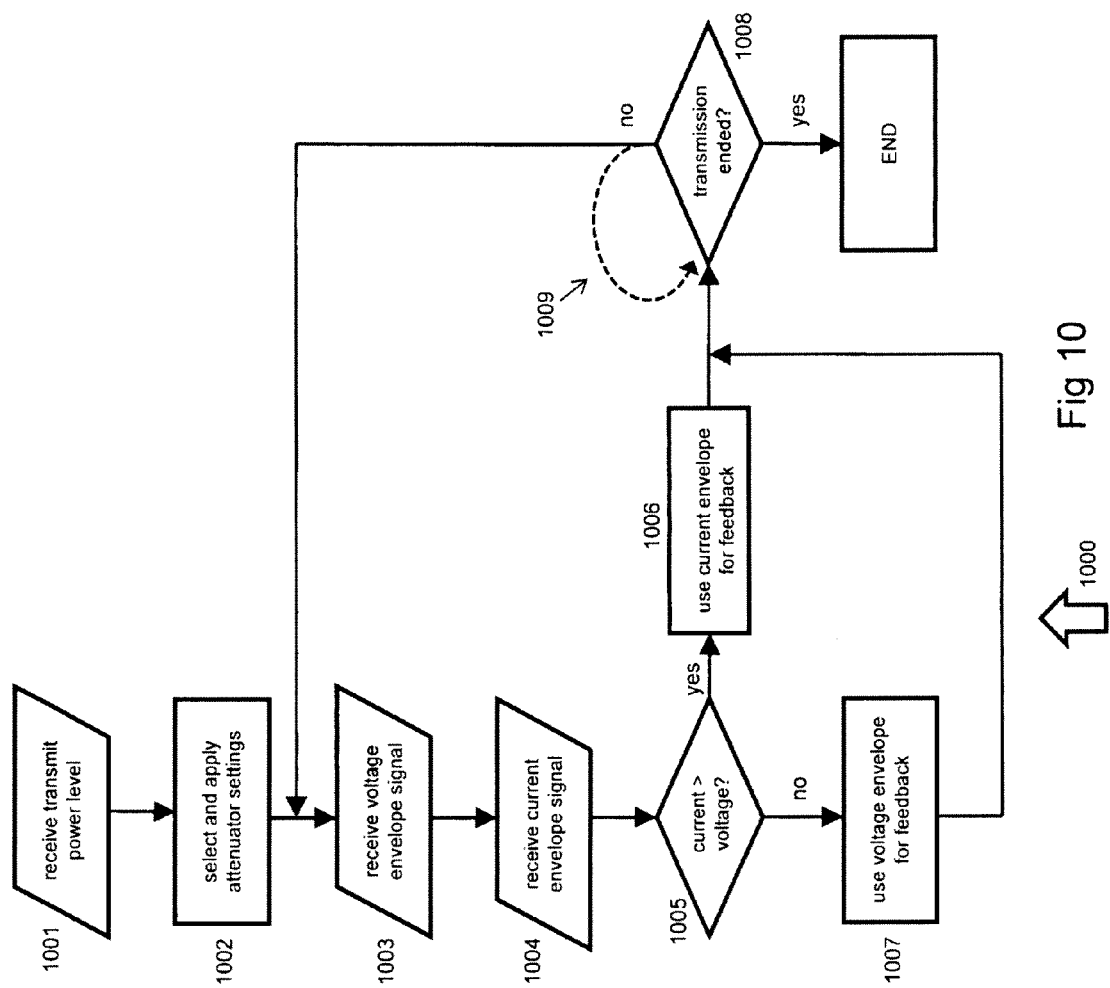
FIG. 10 is a flowchart of a method for closed-loop power amplifier amplitude modulation in accordance with an exemplary embodiment of the present invention.

FIG. 10 is a flowchart method 1000 for closed-loop power amplifier amplitude modulation in accordance with an exemplary embodiment of the present invention. Method 1000 allows a closed-loop power amplifier amplitude modulator utilizing a feedback loop to receive a single modulation input that transitions from a voltage envelope control state to a current envelope control state without requiring multiple inputs and other circuitry for selecting between the voltage envelope and the current envelope. Furthermore, method 1000 allows configuring of attenuator settings according to a desired transmit power level.

Method 1000 begins at 1001 where transmit power level data is received. In one exemplary embodiment, the desired transmit power level can be received at a controller in the form of digital data from a transceiver or baseband circuit. The method then proceeds to 1002.

At 1002 attenuator settings to apply to voltage and current sense paths are selected based on a predetermined transmit power level, such as in response to data that identifies the transmit power level for a current transmit period or other suitable transmit power level data. In one exemplary embodiment, gain settings of a variable gain amplifier can also be adjusted so as to compensate for the effects of the adjusted attenuator settings on the gain of the feedback loop. The method then proceeds to 1003.

At 1003 a voltage envelope signal is received. In one exemplary embodiment, the voltage envelope signal can be derived from the load voltage seen at an output, such as through a capacitive voltage dividing network or other suitable attenuator, and can be received at the controller. The method then proceeds to 1004.

At 1004, a current envelope signal is received. In one exemplary embodiment, the current envelope signal can be generated by a capacitive voltage dividing network or other suitable attenuator, such as one that is in parallel with a bond wire for a secondary winding of a circular geometry power amplifier or other suitable current envelope signals, and can be received at the controller. The method then proceeds to 1005.

At 1005, it is determined whether the current envelope signal is greater than the voltage envelope signal. If the current envelope signal is greater than the voltage envelope the method proceeds to 1006. Otherwise the method proceeds to 1007.

At 1006, a modified power control signal is derived from the current envelope signal and a power control signal. In one exemplary embodiment, this signal is generated by providing the current envelope signal as a feedback signal in a feedback loop, comparing the feedback signal to the power control signal, and controlling the power of the power amplifier in a manner so as to reduce the difference between the two. The method then proceeds to 1008.

At 1007, a modified power control is derived from the voltage envelope signal and a power control signal. In one exemplary embodiment, this signal is generated by providing the voltage envelope signal as a feedback signal in a feedback loop, comparing the feedback signal to the power control signal, and controlling the power of the power amplifier in a manner so as to reduce the difference between the two. The method then proceeds to 1008.

At 1008 it is determined whether the transmission has reached a conclusion. In one exemplary embodiment, this information can be provided in digital form by a transceiver or baseband circuit. If the transmission is determined to be complete, method 1000 can end. If desired, method 1000 can begin again at 1001 upon initiation of another transmission or transmit data burst. If it is determined that the transmission is not concluded, the method proceeds back to 1003.

In an alternate configuration, method 1000 can instead return back to 1008 from 1008 if the transmission has not concluded, as indicated in dashed arrow 1009. This can provide advantage if the first comparison between voltage and current is sufficient to predict the outcome of future measurements, or if switching between voltage and current states causes an undesired effect such as glitching in the output, or for other suitable reasons.

In operation, method 1000 allows the closed-loop modulation of a power amplifier to be maintained based on the greater of a voltage envelope signal or a current envelope signal without requiring separate control circuitry for each. Method 1000 also allows attenuation levels to be set prior to initiation of transmission, allowing any detectors used in generating voltage and current envelope signals to be provided with a suitably attenuated signal level. In one exemplary embodiment, method 1000 can be used in power amplifiers having bond wire connections where a voltage is generated that is proportional to a current being provided to a load, and also where the load voltage can be measured, such as by using a capacitive voltage divider.

In view of the above detailed description of the present invention and associated drawings, other modifications and variations are apparent to those skilled in the art. It is also apparent that such other modifications and variations may be effected without departing from the spirit and scope of the present invention.

What is claimed is:

1. A system for controlling amplifier power comprising:
a detector receiving a voltage envelope signal and a current envelope signal and generating a control signal based on a greater of the voltage envelope signal and the current envelope signal;
a power amplifier level controller receiving the control signal and generating a power amplifier level control signal; and
a variable gain amplifier coupled to the detector and the power amplifier level controller, the variable gain amplifier increasing a gain of the control signal when attenuation control data decreases an attenuation for one or more of the voltage envelope signal or the current envelope signal.

2. The system of claim 1 wherein a controller receives power level data and reduces attenuation for one or more of a voltage sense signal that is used to generate the voltage envelope signal and a current sense signal that is used to generate the current envelope signal as a function of a decrease in an average power level.

3. The system of claim 2 further comprising an attenuator coupled to a power amplifier output, the attenuator for attenuating the voltage sense signal.

4. The system of claim 2 further comprising an attenuator coupled to a current path of the power amplifier, the attenuator for attenuating the current sense signal.

5. The system of claim 1 wherein the detector further comprises a current envelope detector generating the current envelope signal.

6. The system of claim 5 wherein the current envelope detector further comprises a transistor receiving a control signal from an attenuator coupled in parallel with a bond wire of a distributed active transformer.

7. The system of claim 1 further comprising an offset canceling circuit generating an offset signal that is approximately equal to an offset signal of a greater of the voltage envelope signal and the current envelope signal.

8. The system of claim 1 wherein the detector further comprises a voltage envelope detector generating the voltage envelope signal.

9. A power amplifier with power control comprising:
a detector for detecting one or more of a voltage envelope and a current envelope;
a controller for controlling an attenuation of one or more of the voltage envelope and the current envelope;
means for generating a control signal based on the greater of the voltage envelope and the current envelope; and
a variable gain amplifier coupled to the detector and a power amplifier level controller, the variable gain amplifier increasing a gain of a control signal generated by the detector when the controller decreases an attenuation for one or more of the voltage envelope or the current envelope.

10. The power amplifier of claim 9 further comprising a power amplifier level controller receiving the control signal and generating a power amplifier level control signal.

11. The power amplifier of claim 9 wherein the power amplifier comprises a distributed active transformer.

12. The power amplifier of claim 9 further comprising a capacitor having a first terminal coupled to the detector and a second terminal coupled to voltage common.

13. The power amplifier of claim 9 further comprises a compensator for compensating for the attenuation of one or more of the voltage envelope and the current envelope.

14. The power amplifier of claim 9 further a generator for generating an offset signal that is approximately equal to an offset signal of the greater of the voltage envelope signal and the current envelope signal.

15. A method for generating a power amplifier control signal comprising:
attenuating one or more of a voltage envelope signal or a current envelope signal based on power level data;
generating a power amplifier control signal based on a detector control signal and a greater of the attenuated voltage envelope signal or the attenuated current envelope signal; and
increasing a gain of the detector control signal using a variable gain amplifier when attenuation control data decreases an attenuation for one or more of the voltage envelope signal or the current envelope signal.

16. The method of claim 15 further comprising providing the power amplifier control signal to a power amplifier.

17. The method of claim 15 further comprising:
determining a difference between the power amplifier control signal and a power control input signal; and
adjusting the power amplifier control signal based on the difference between the power amplifier control signal and the power control input signal.

18. The method of claim 15 further comprising compensating the power amplifier control signal for the attenuation of one or more of the voltage envelope signal or the current envelope signal.

19. The method of claim 15 wherein generating the voltage envelope signal further comprises compensating the voltage envelope signal for an offset.

20. The method of claim 15 wherein attenuating one or more of the voltage sense signal or the current sense signal based on power level data comprises attenuating one or more of the voltage sense signal or the current sense signal based on average power level data to reduce attenuation for one or more of the attenuated voltage sense signal and the attenuated current sense signal as a function of the decrease in an average power level.

* * * * *